United States Patent
Pettus

(10) Patent No.: US 9,893,406 B2
(45) Date of Patent: Feb. 13, 2018

(54) METHOD OF FORMING A WAVEGUIDE INTERFACE BY PROVIDING A MOLD TO FORM A SUPPORT BLOCK OF THE INTERFACE

(71) Applicant: Vubiq Incorporated, Aliso Viejo, CA (US)

(72) Inventor: Michael Gregory Pettus, Laguna Niguel, CA (US)

(73) Assignee: Vubiq Networks, Inc., Irvine, CA (US)

( * ) Notice: Subject to any disclaimer, the term of this patent is extended or adjusted under 35 U.S.C. 154(b) by 42 days.

(21) Appl. No.: 14/803,652

(22) Filed: Jul. 20, 2015

(65) Prior Publication Data

US 2016/0013534 A1 Jan. 14, 2016

Related U.S. Application Data

(63) Continuation-in-part of application No. 13/383,203, filed as application No. PCT/US2010/046028 on Aug. 19, 2010, now Pat. No. 9,088,058.

(60) Provisional application No. 61/235,245, filed on Aug. 19, 2009.

(51) Int. Cl.
*H01P 5/107* (2006.01)
*H01P 1/04* (2006.01)

(52) U.S. Cl.
CPC .............. *H01P 5/107* (2013.01); *H01P 1/042* (2013.01)

(58) Field of Classification Search
CPC ........... H01P 5/107; H01P 5/103; H01P 1/042
USPC .......................................................... 333/26
See application file for complete search history.

(56) References Cited

U.S. PATENT DOCUMENTS

| | | | | |
|---|---|---|---|---|
| 4,458,222 A | * | 7/1984 | Herstein et al. | H01P 5/107 333/247 |
| 4,754,239 A | * | 6/1988 | Sedivec | H01P 5/107 333/26 |
| 5,235,300 A | * | 8/1993 | Chan et al. | H01L 23/66 257/728 |

(Continued)

FOREIGN PATENT DOCUMENTS

| | | |
|---|---|---|
| DE | 19725492 C1 | 8/1998 |
| JP | 60-230701 | 11/1985 |

(Continued)

OTHER PUBLICATIONS

Office Action for Korean Application No. 10-2012-7006846, Nov. 5, 2016, pp. 1-9.

(Continued)

*Primary Examiner* — Benny Lee
(74) *Attorney, Agent, or Firm* — LeClairRyan, a Professional Corporation

(57) ABSTRACT

A waveguide interface comprising a support block configured to support a printed circuit board assembly. An interface is coupled to an end portion of the support block and extends from the support block. The interface includes a slot positioned to receive at least a portion of the printed circuit board assembly and one or more holes positioned to receive attachment devices to secure the interface to a waveguide component. The support block and interface are molded as a monolithic device. A method of forming the waveguide interface, a waveguide assembly including the waveguide interface, and a method of making the waveguide assembly including the waveguide interface are also disclosed.

14 Claims, 16 Drawing Sheets

(56) References Cited

U.S. PATENT DOCUMENTS 6,987,429 B2 * 1/2006 Shih et al. ............. H01P 11/00
333/26
9,088,058 B2 * 7/2015 Pettus et al. ............ H01P 1/042

FOREIGN PATENT DOCUMENTS

JP        06-038304     5/1994
JP        2005-536144    11/2005

OTHER PUBLICATIONS

Leong, Kevin et al., "A 340-380 GHz Integrated CB-CPW-to-Waveguide Transition for Sub Millimeter-Wave MMIC Packaging", IEEE Microwave and Wireless Components Letters, vol. 19, No. 6, Jun. 2009.
European Search Report for EP Application No. 10810601.4, dated Nov. 10, 2017, pp. 1-9.

* cited by examiner

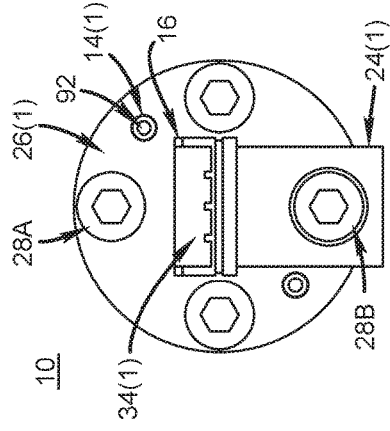
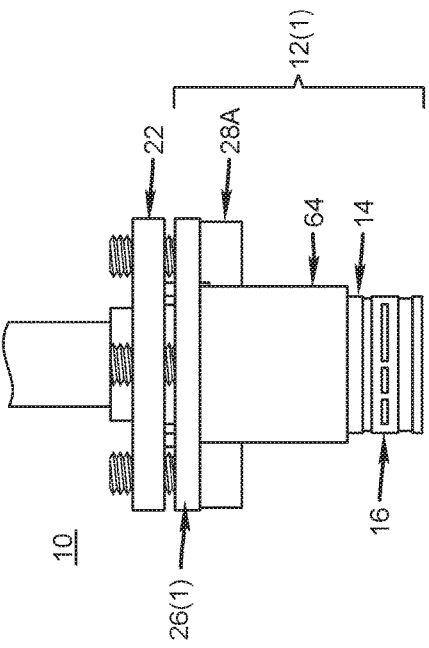
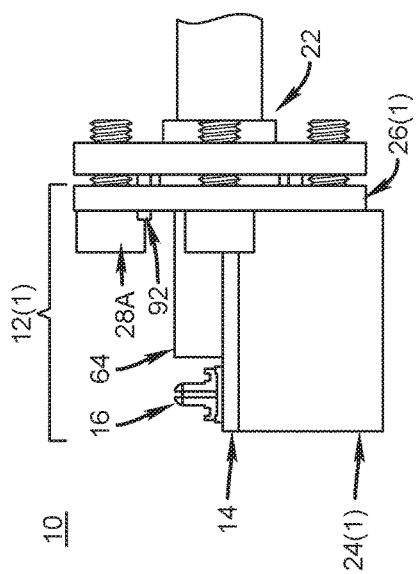

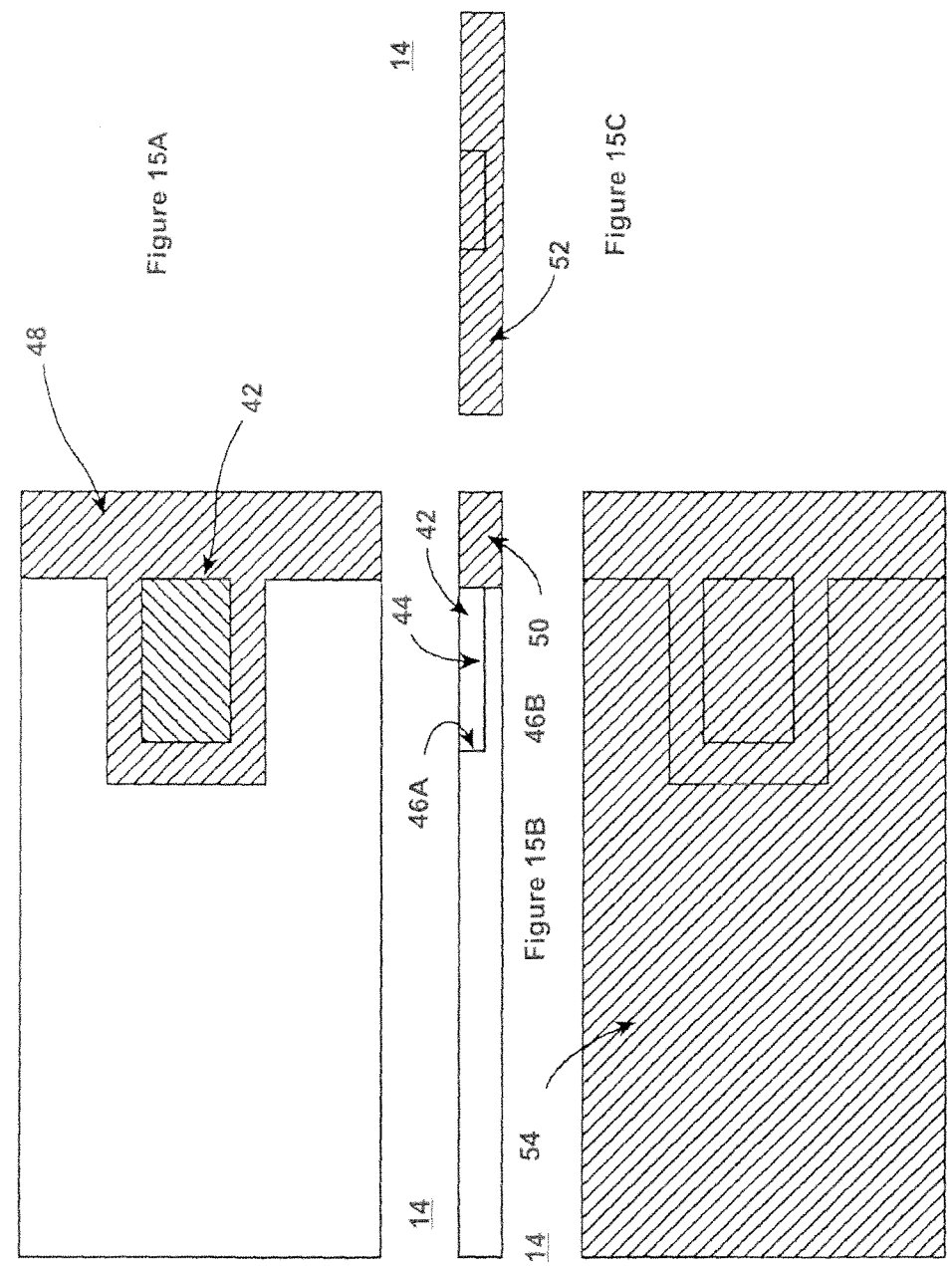

METHOD OF FORMING A WAVEGUIDE INTERFACE BY PROVIDING A MOLD TO FORM A SUPPORT BLOCK OF THE INTERFACE

This application is a continuation-in-part of U.S. patent application No. 13/383,203 filed on Jan. 9, 2012, now U.S. Pat. No. 9,088,058 issued Jul. 21, 2015, which is a national phase filing under 35 USC 371 of International Application No. PCT/US2010/046028 having an International Filing Date of Aug. 19, 2010, which claims the benefit of priority based on U.S. Provisional Patent Application Ser. No. 61/235,245, filed on Aug. 19, 2009, each of which is incorporated herein by reference in its entirety.

FIELD

The present disclosure relates generally to microwave and millimeter wave radio frequency waveguide assembly technologies. More specifically, the present disclosure relates to microwave and millimeter wave radio frequency waveguide interface technologies, including waveguide interfaces manufactured using injection molding techniques.

BACKGROUND

As the semiconductor industry continues to increase circuit complexity and density by reduction of process node geometries, operating signal frequencies continue to increase. It is now possible to obtain semiconductors that operate well into the millimeter wave region of radio spectrum (30 GHz to 300 GHz). Traditionally, the types of semiconductors used have been in the category of "III-V" types, indicating that the semiconductor compounds have been derived from periodic table elements in the third and fifth columns, such as gallium arsenide (GaAs) and indium phosphide (InP). In recent years, less expensive semiconductor processes that arise from column IV of the periodic table, such as silicon (Si) and germanium (Ge) have been produced in silicon CMOS (complementary metal oxide semiconductor) and silicon germanium (SiGe) compounds. The result has been to extend the operating frequency of low-cost silicon semiconductors well into the 60 to 80 GHz range of frequencies. The availability of low-cost semiconductor technology has put pressure on millimeter wave manufacturers to bring the overall costs down for the electromechanical support mechanisms that enable these semiconductor devices.

Commercial waveguide structures enable low-loss energy transfer at millimeter wave frequencies, with the additional benefit of standardization of size and mechanical coupling flange designs. The standardized sizes and coupling flanges enable interoperability between different devices and different manufactures, providing maximal flexibility for millimeter wave system design.

Traditional methods for interfacing semiconductor devices within a mechanical waveguide have been to either provide a split-cavity type of assembly with expensive precision machining requirements or to couple energy from an orthogonal planar printed circuit launch probe with associated lossy energy transfer. With new semiconductor designs providing balanced transmission line outputs, there has been no straightforward electromechanical method for coupling millimeter wave energy from the balanced outputs directly to a waveguide without added circuitry, such as a balun transformer, which also exhibits excessive losses as the frequency range of operation increases.

The prior art methods for coupling energy into and out of semiconductor devices, as set forth above, can be divided into two categories. The first category involves the use of split-cavity metallic structures that allow the semiconductor chip to be placed into one of the cavities, with the other half of the cavity then brought together with the first half in a precision fit. The typical precision required for the internal dimensions of a millimeter wave waveguide is on the order of ±0.001" (0.025 mm). Obtaining this level of precision in the construction of both upper and lower cavity halves of a split cavity metallic structure through machining while maintaining registration alignment for such an assembly is expensive.

The second category used for coupling energy in and out of semiconductor devices is to provide a printed circuit board with a stub or paddle energy launch. The stub or paddle launch is orthogonal to the waveguide cavity, also requiring a split-cavity type of assembly method, creating additional expense.

In each case, a custom, highly precision machining process is required to maintain the internal waveguide dimensional requirements. Some cost reduction can be afforded through a casting process, but secondary machining operations are still necessary to realize the precision needed.

The above prior methods also are designed for single-ended circuit configurations only. It is necessary, however, to provide low-cost and efficient coupling methods for both single-ended and differential circuits. Millimeter wave semiconductor circuit designs often make use of differential amplifier and output stage configurations to enable high gain and power efficiencies.

SUMMARY OF THE INVENTION

A waveguide interface comprising a support block configured to support a printed circuit board assembly. An interface is coupled to an end portion of the support block and extends from the support block. The interface includes a slot positioned to receive at least a portion of the printed circuit board assembly and one or more holes positioned to receive attachment devices to secure the interface to a waveguide component. The support block and interface are molded as a monolithic device.

A method of forming a precision waveguide interface includes providing a mold configured to form a support block configured to support a printed circuit board assembly and an interface integrally formed to an end portion of the support block and that extends from the support block. The interface includes a slot configured to receive at least a portion of the printed circuit board assembly and one or more holes positioned to receive attachment devices to secure the interface to a waveguide component. The provided mold is utilized to form the waveguide interface as a monolithic device.

This exemplary technology provides a number of advantages including providing a waveguide assembly, including a waveguide interface that may be utilized at high operating frequencies. The waveguide assembly of the present technology incorporates, in one example, a waveguide interface that is molded as a single piece with nominal impact on the overall performance of the waveguide assembly.

BRIEF DESCRIPTION OF THE DRAWINGS

FIGS. 1A-1C are side, front end, and top views, respectively, of an exemplary waveguide assembly including an exemplary waveguide interface coupled to a waveguide flange;

FIGS. 15A-15D are respectively a top, side, end, and bottom view of an exemplary printed circuit board for use with the exemplary waveguide interfaces of the present technology.

DETAILED DESCRIPTION OF THE INVENTION

Figure 2:
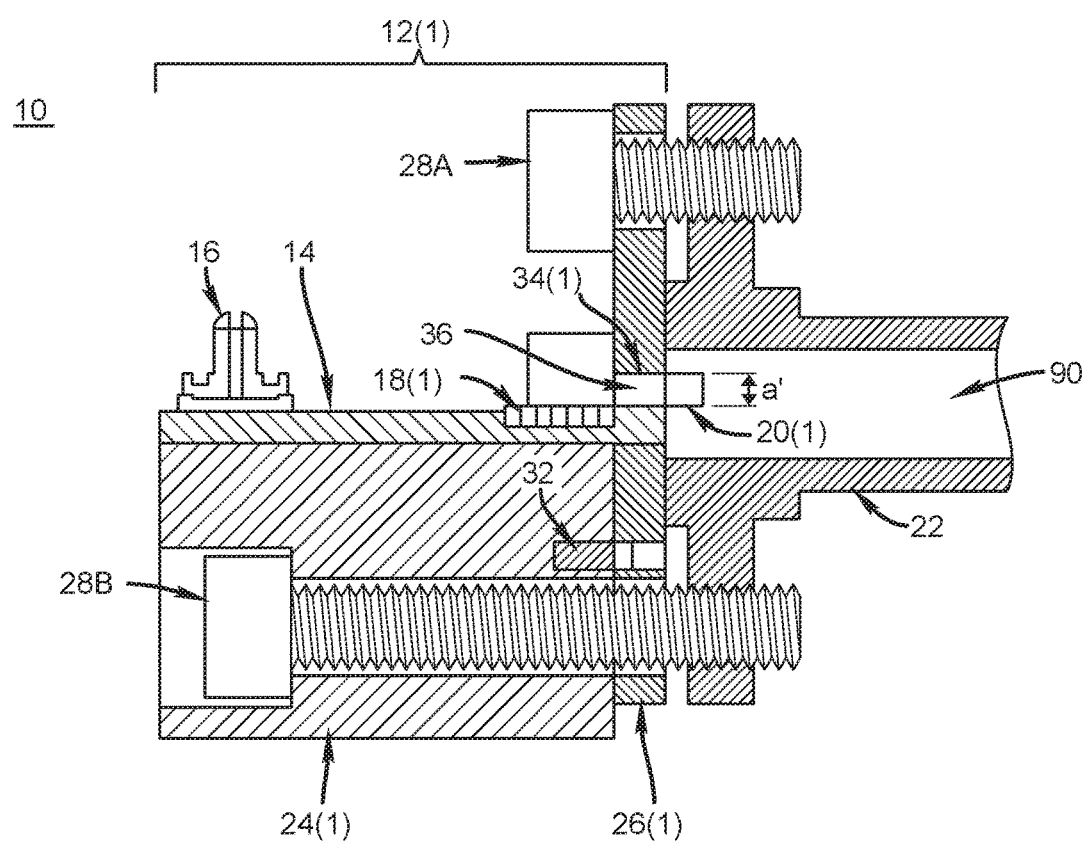
FIG. 2 is a cross sectional side view of the exemplary waveguide assembly shown in FIGS. 1A-1C.

Referring to FIGS. 1A, 1B, 1C, 2, 3, and 4, an example of a waveguide assembly 10 includes an exemplary waveguide interface 12(1) (shown in FIGS. 1A, 1C, 2, and 4), a printed circuit board assembly 14 (FIGS. 1A, 1C, 2, 3 and 4) including a connector 16, a communication device 18(1) (shown in FIGS. 2, 3, and 4), a launch transducer 20(1) (shown in FIGS. 2 and 4), and a waveguide flange 22 (shown in FIGS. 1A, 1C, 2, 3, and 4, is illustrated, although the waveguide assembly 10 could include other types and numbers of assemblies, devices, components, and/or other elements in other configurations. As described below, the waveguide assembly 10 may be utilized for electromagnetic transmission and electromagnetic reception. Both the transmission context and the reception context equally apply due to the Lorentz electromagnetic reciprocity theorem. This exemplary technology provides a number of advantages including providing a waveguide assembly, including a waveguide interface that may be utilized at high operating frequencies. The waveguide assembly of the present technology incorporates, in one example, a waveguide interface that is molded as a single piece with nominal impact on the overall performance of the waveguide assembly. The molded waveguide interface significantly reduces the overall cost of the waveguide assembly.

Referring again to FIGS. 1A, 1B, 1C, 2, 3, and 4, the exemplary waveguide interface 12(1) includes a support block 24(1) (shown in FIGS. 1A, 1B, 2, and 3) coupled to an interface plate 26(1), although the waveguide interface 12(1) may include other elements in other configurations. The waveguide interface 12(1) operates in the waveguide assembly 10 to provide an interface between the waveguide flange 22 and the communication device 18(1). In one example, as described further below, a waveguide interface may be utilized in the waveguide assembly 10 that is constructed as a single, monolithic, metal injection-molded structure, such as the waveguide interface 12(2) illustrated in FIGS. 7, 8, 9, 10, 11, 12, 13, and 14. The metal injection-molded waveguide interface 12(2) advantageously provides a more economically produced waveguide interface that may be utilized at high operating frequencies, with nominal impact on the performance of the waveguide assembly 10.

Referring again to FIGS. 1A, 1B, 1C, 2, 3, and 4, the support block 24 (1) is configured to support the printed circuit board assembly 14 having the connector 16, the communication device 18(1), and the launch transducer 20(1) located on a surface thereof. The support block 24(1) extends in a plane orthogonal to the interface plate 26(1) and provides for precise alignment of the printed circuit board assembly 14 with the interface plate 26(1) and the waveguide flange 22.

The support block 24(1), in this example, is coupled to the interface plate 26(1) and the waveguide flange 22 by machine screws 28A (shown in FIGS. 1A, 1B, 1C, 2, and 3) and 28B (shown in FIGS. 1B, 2, and 3), although other types of fasteners may be utilized. Machine screws 28A and 28B couple both the support block 24(1) and the interface plate 26(1) to the waveguide flange 22 such that the interface plate 26(1) is positioned between the support block 24(1) and the waveguide flange 22. In another example, as illustrated in FIGS. 7, 8, 9, 10, 11, 12, 13, and 14, the support block 24(2) as shown in FIGS. 7, 8, 10, 11, 12 and 13 and the interface 26(2) as shown in FIGS. 7-14 are molded as a single device and do not require any fastening elements to be coupled together as shown in FIGS. 7, 8, 11, 12, and 13.

Figure 6C:
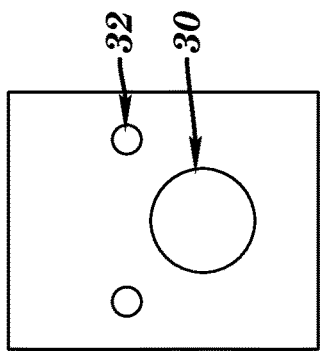
FIGS. 6A-6C are a front view, side cross-sectional view, and an end view of a support block of the exemplary waveguide interface shown in FIGS. 1A-1C.
Figure 6B:
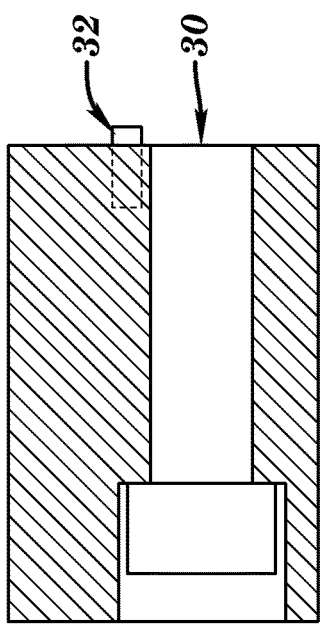
Figure 6A:
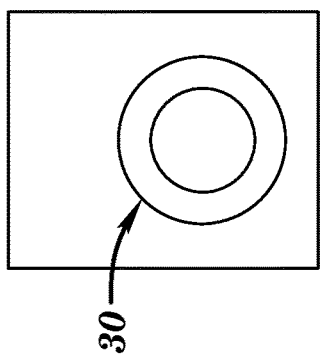

Referring now to FIGS. 6A-6C, in one example, the support block 24(1) includes a counter-bored hole 30 that allows a machine screw, such as the machine screw 28B (FIGS. 1B, 1C, 2, 3) to be inserted therein to couple the support block 24(1) to the waveguide flange 22 and the interface plate 26(1), as shown in FIG. 2, although the support block 24(1) may include other fastening elements in other locations to facilitate the coupling of the support block 24(1) to the interface plate 26(1) and waveguide flange 22. In one example, as described below, support block 24(2) and interface 26(2) are formed as a single, monolithic, part, such that no fastening elements are required on support block 24(2). As shown in FIGS. 6B and 6C, the support block 24(1) optionally includes one or more support block guide pins 32 (also shown in FIG. 2) that aid in alignment of the support block 24(1) with the interface plate 26(1) as discussed further below.

Referring now more specifically to FIGS. 1A, 1B, 1C, 2, 3, 4, and 5B, interface plate 26(1) is a circular interface plate, although other configurations may be utilized for the interface plate 26(1). The interface plate 26(1) includes a rectangular slot 34(1) (shown in FIGS. 1B, 2, 3, and 5B) located therethrough. The length of the rectangular slot 34(1) is configured to accept the printed circuit board assembly 14 and the launch transducer 20(1) as illustrated in FIG. 2. The printed circuit board assembly 14 and the rectangular slot 34(1) form a short waveguide segment 36 as shown in FIG. 2 within the rectangular slot 34(1) when coupled.

Referring again to FIG. 5B, the interface plate 26(1) includes interface plate holes 38 which are sized and configured to receive machine screws 28A and 28B (not shown in FIG. 5B), which secure the waveguide interface 12(1) to the waveguide flange 22 as shown in FIG. 2. The interface plate 26(1) may further have interface plate guide pin holes 41(1) that may be aligned with support block guide pins 32 of the support block 24(1) as shown in FIG. 2 to provide precise alignment between the interface plate 26(1) and the support block 24(1). The interface plate 26(1) further includes guide pin holes 40 that are configured to aid in alignment with the waveguide flange 22 as described further below.

Referring now to FIGS. 7-14, another example of a waveguide interface 12(2) for use in waveguide assembly 10 is illustrated. Waveguide interface 12(2) interacts with waveguide flange 22 and operates in the same manner as waveguide interface 12(1) except as illustrated and described herein.

Waveguide interface 12(2) includes a support block 24(2) and an interface 26(2) that are molded in an injection molding process as a single, monolithic structure, although other types of molding techniques may be utilized. The waveguide interface 12(2), by way of example only, may be constructed of an injection moldable metal alloy such as Xyloy™ M950, although other types of moldable metal alloys may be utilized to form the waveguide interface 12(2). The outer shape of the waveguide interface 12(2) has been customized to allow for removal from a mold to enable the generation of the single monolithic structure, as discussed below. Specifically, the waveguide interface 12(2) includes a plurality of draft angles as discussed below. The draft angles, discussed more specifically below, provide for removal of the waveguide interface 12(2) without significant impact to the overall performance on the waveguide interface 12(2) in the waveguide assembly 10. In particular, by way of example only, the propagation of millimeter wave energy into the opening of a waveguide flange connected to the waveguide interface 12(2) is altered by less than one percent, which does not impact the overall operating frequency range. Further, the waveguide cutoff frequency is altered by less than one percent. Although various exemplary dimensions are described below, it is to be understood that the dimensions may be varied.

Support block 24(2) includes a top surface 100 (FIGS. 8, 10, 11, and 12) configured to support a printed circuit board assembly, such as printed circuit board assembly 14, by way of example. By way of example, the printed circuit board assembly may be attached to the top surface 100 of the support block 24(2) using an adhesive. The top surface 100 has side edges 102 (shown in FIGS. 7, 8 and 12) that are tapered with a draft angle of approximately a 4 degree angle as illustrated in FIGS. 8 and 12. As used herein throughout, the term "draft angle" refers to the amount of taper perpendicular to the parting line for the molded or casted part described, as measured in degrees. The top surface 100 of the support block 24(2) has a width of approximately 0.400 inches at a junction 104 (FIGS. 7, 8, 10, and 11) with the interface 26(2) and a width of approximately 0.358 inches at an upper end edge 105 (FIGS. 7, 8, and 12) thereof. The side edges 102 taper from the junction 104 to the upper end edge at the draft angel of approximately 4 degrees.

Figure 7:
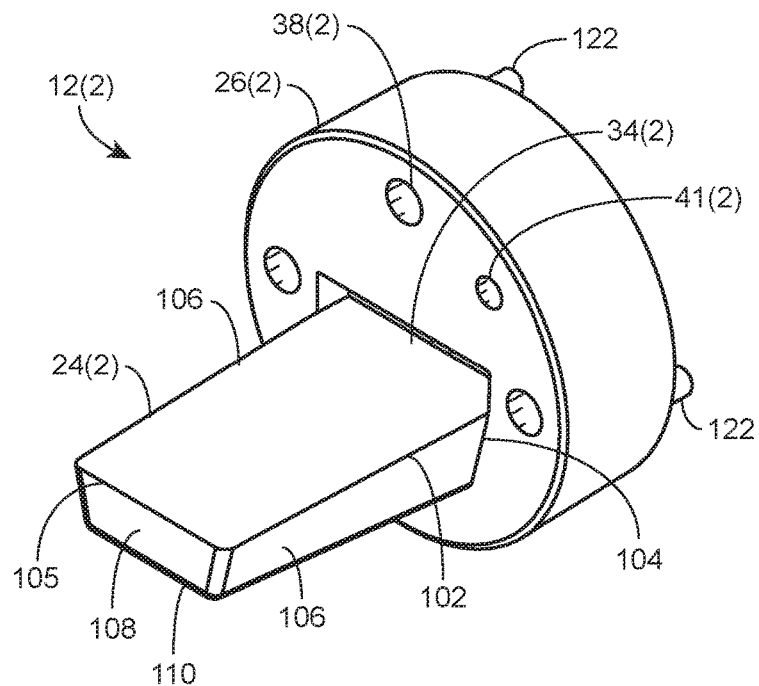
FIG. 7 is a perspective view of another exemplary waveguide interface that is molded as a single, monolithic device.
Figure 8:
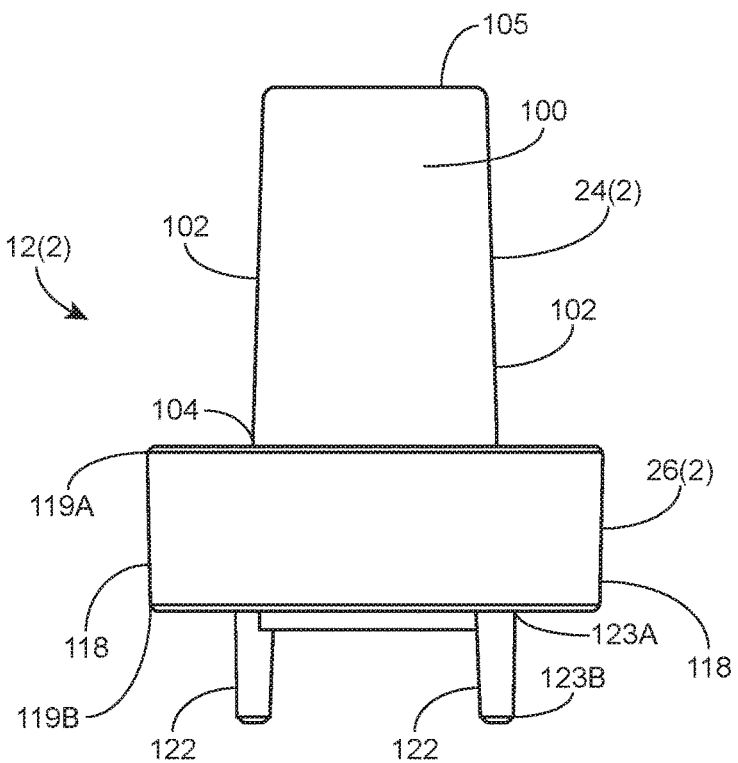
FIG. 8 is a top view of the exemplary waveguide interface shown in FIG. 7.
Figure 9:
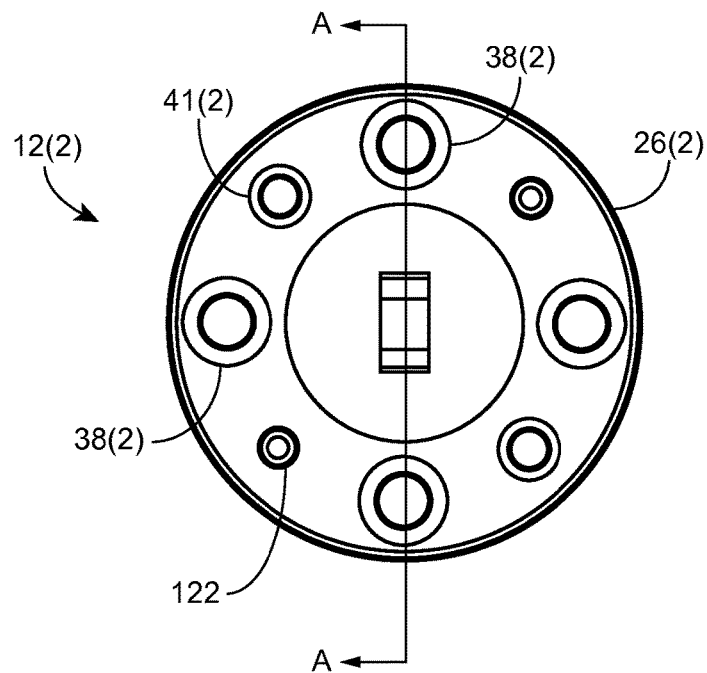
FIG. 9 is a rear view of the exemplary waveguide interface shown in FIG. 7.
Figure 10:
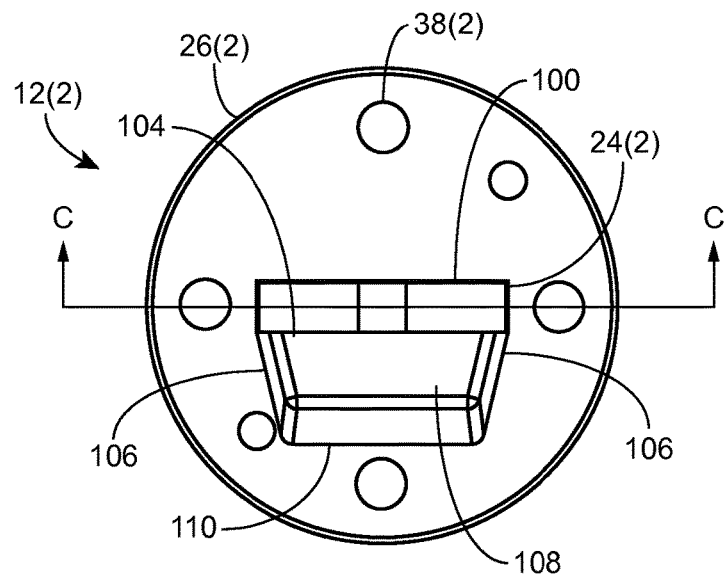
FIG. 10 is a front view of the exemplary waveguide interface shown in FIG. 7.

The support block 24(2) includes sides 106 and end 108 as shown in FIGS. 7 and 10 that taper downward from the top surface 100 with a draft angle of approximately 4 degrees, such that the support block 24(2) has a width of approximately 0.315 inches at a lower end edge 110 shown in FIGS. 7 and 10. The support block 24(2) further includes a tapered bottom surface 112 at a draft angle of approximately 4 degrees as shown in FIG. 11, such that support block 24(2) has a height of approximately 0.177 inches at the junction 104 with the interface 26(2) and a width of approximately 0.120 inches from the lower end edge 110 to the top surface 100, although support block 24(2) may have other dimensions.

In this example, with the modified design with the draft angles and dimensions noted above, the support block 24(2) and the interface 26(2) can be molded as a single, monolithic device. The support block 24(2) extends from the interface 26(2) in a plane orthogonal to the interface 26(2). The interface 26(2) is a circular interface configured to be coupled to a waveguide flange (not shown), such as waveguide flange 22, which by way of example may be a standard waveguide flange known in the art. The interface 26(2) includes a slot 34(2) (shown in FIGS. 7 and 11) configured to receive a portion of a printed circuit board assembly, including a launch transducer. In use, the slot 34(2) and an inserted printed circuit board assembly form a short waveguide segment within the waveguide interface 12(2) in the same manner as described with respect to the waveguide interface 12(1) above.

Figure 11:
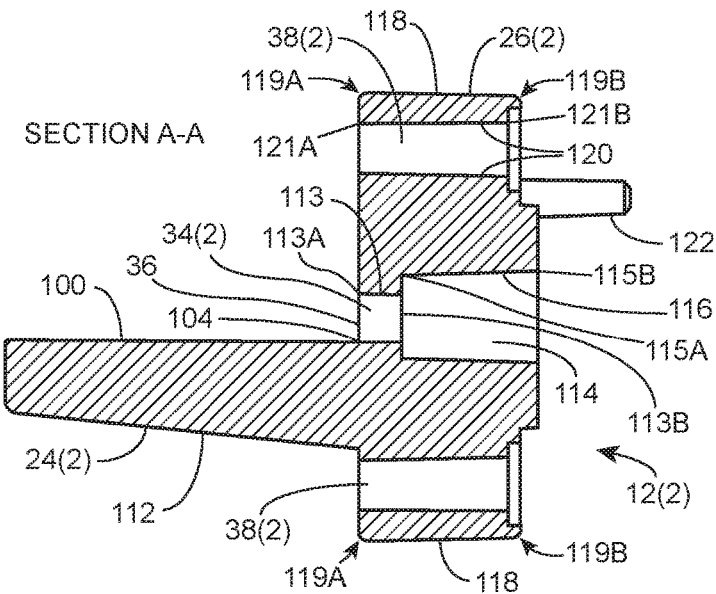
FIG. 11 is a side cross-sectional view of the exemplary waveguide interface shown in FIG. 9 along section A-A.
Figure 12:
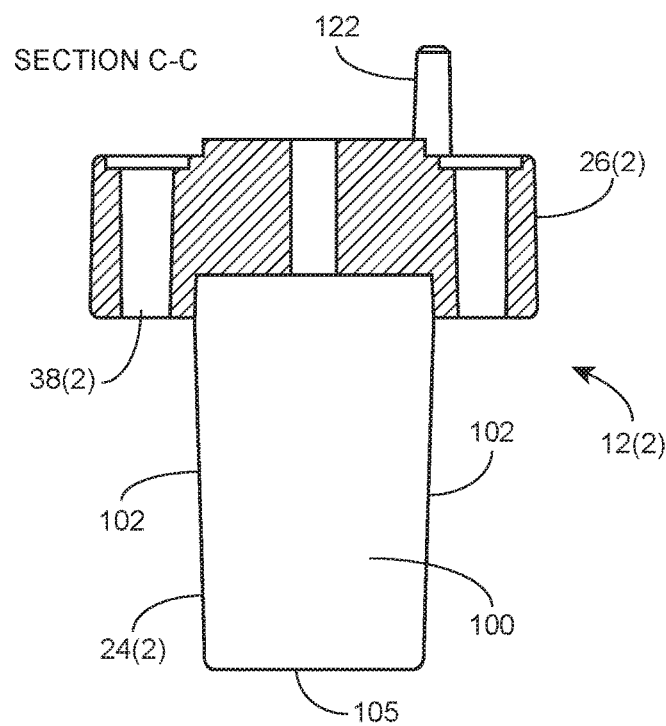
FIG. 12 is a top cross-sectional view of the exemplary waveguide interface shown in FIG. 10 along section C-C.

In this example, the slot 34(2) has width of approximately 0.400 inches and a height of approximately 0.080 inches at the front opening as illustrated in FIG. 11. The slot 34(2) includes a tapered top surface 113 with a draft angle of approximately 2.0 degrees from a front end 113A to a rear end 113B of the slot 34(2). The slot 34(2) also includes a rear portion 114 with a tapered side 116 with a draft angle of approximately 4 degrees from a front end 115A to a rear end 115B of the rear portion 114. The rear portion 114 meets with an opening in a standard waveguide flange.

The interface 26(2) includes outer edges 118 with a draft angle of approximately 2 degrees from a front end 119A to a rear end 119B of the outer edge 118 as shown in FIGS. 8 and 11. The interface 26(2) further includes a number of interface holes 38(2) (shown in FIGS. 7, 9, 10, 11, 12, 13, and 14) located therethrough. The interface holes 38(2) are configured to receive machine screws to facilitate coupling of the waveguide interface 12(2) to a waveguide flange. The interface holes 38(2) include tapered side walls 120 with a draft angle of approximately 2 degrees from a front end 121A to a rear end 121B of the side walls 120 to facilitate removal from the mold as shown in FIG. 11. The interface holes 38(2) are drilled or reamed and tapped with 4-40 threads, although other threads may be utilized, to result in a non-tapered hole in the finished part as discussed below. The interface 26(2) also includes guide pin holes 41(2) (as shown in FIGS. 7, 9, 13, and 14) to provide alignment with the guide pins of a standard waveguide flange.

The interface 26(2) also includes interface guide pins 122 (shown in FIGS. 7, 8, 9, 11, 12, 13, and 14) located on a rear surface of the interface 26(2) that provide alignment between the interface 26(2) and a waveguide flange, although the interface 26(2) may have other devices in other locations to facilitate alignment between the interface 26(2) and a standard waveguide flange. In this example, the interface guide pins 122 have a tapered shape with a draft angle of approximately 2 degrees from a front end 123A to a rear end 123B of the interface guide pins 122 as shown in FIG. 8.

Figure 13:
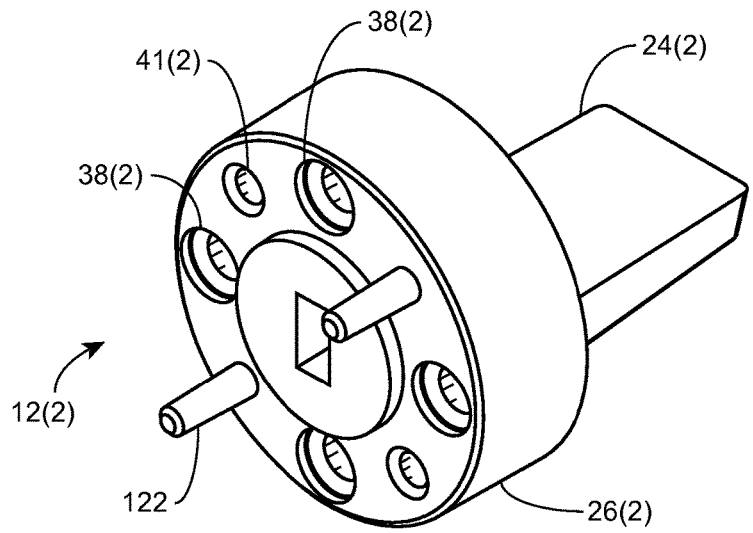
FIG. 13 is a perspective view of the exemplary waveguide interface shown in FIG. 7 after machining processes to finalize the waveguide interface.
Figure 14:
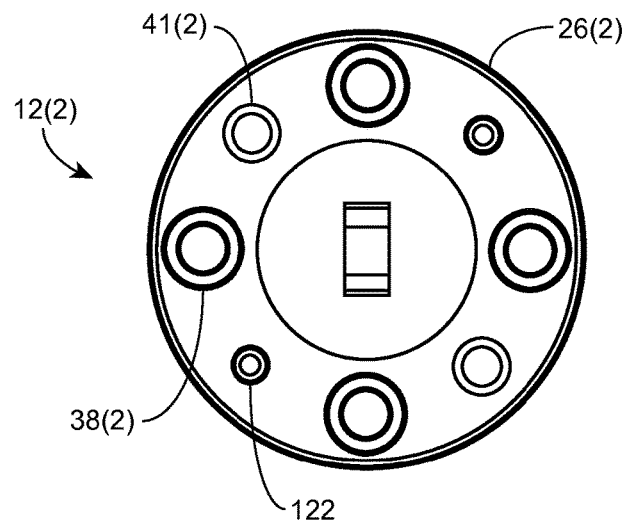
FIG. 14 is a rear view of the exemplary waveguide interface illustrated in FIG. 13.

Referring now to FIGS. 13 and 14, the interface holes 38(2) and guide pin holes 41(2) are machined after the molding process to finalize the waveguide interface 12(2). Specifically, interface holes 38(2) are tapped with an oversized tap so that the interface holes 38(2) are configured to accommodate plating therein. The interface holes 38(2) are further drilled or reamed, by example with a 4-40 thread, in order for the interface holes 38(2) to accommodate screws for connecting the interface 26(2). Further, the guide pin holes 41(2) are reamed to allow for entry of a slip fit dowel pin when coupled to a standard waveguide flange. The waveguide interface 12(2) is further machined to remove all sharp edges resulting from the molding process.

Figure 4:
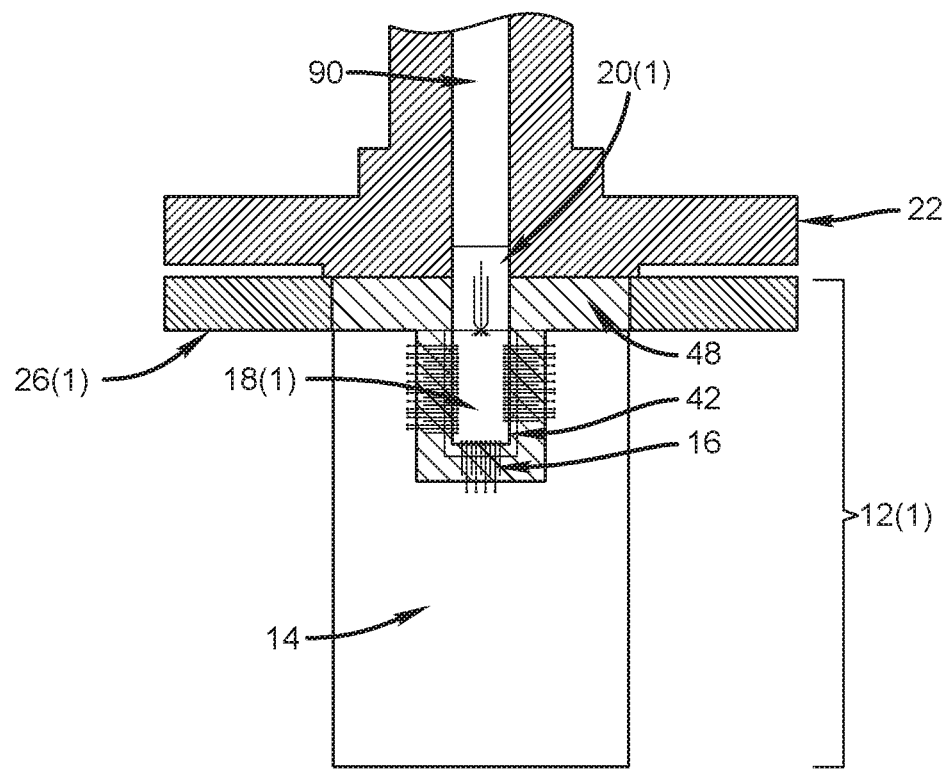
FIG. 4 is a cross sectional top view of the exemplary waveguide assembly shown in FIGS. 1A-1C.

Referring now to FIGS. 15A-15D, top, side, front end, and bottom views of the exemplary printed circuit board assembly 14 shown in FIG. 4 are illustrated, respectively. Printed circuit board assembly 14 includes a cut out area 42 (shown in 15A and 15B) configured to receive the communication device 18(1) (not shown herein), such that the communication device 18(1) sits within the recessed cut out bottom surface 44 and cut out side surfaces 46A and 46B (shown in FIG. 15B). Communication device 18(1) is coupled to the printed circuit board assembly 14 using a conductive epoxy adhesive. Various conductive epoxy adhesives are known in the art and are not discussed herein.

Figure 16A:
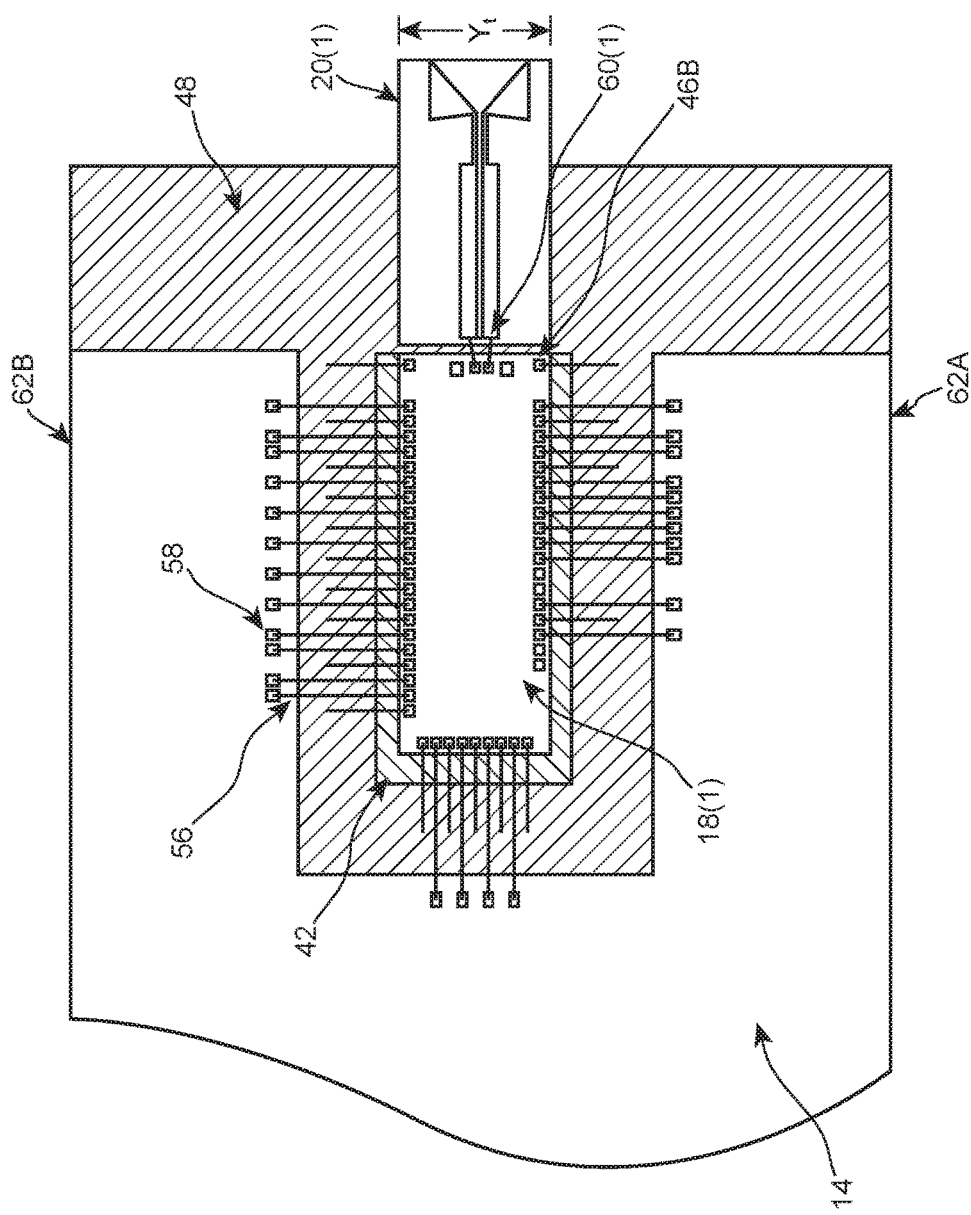
FIG. 16A is a top view of an exemplary transmitter printed circuit board and launch transducer substrate assembly for use with the waveguide interfaces of the present technology.
Figure 16B:
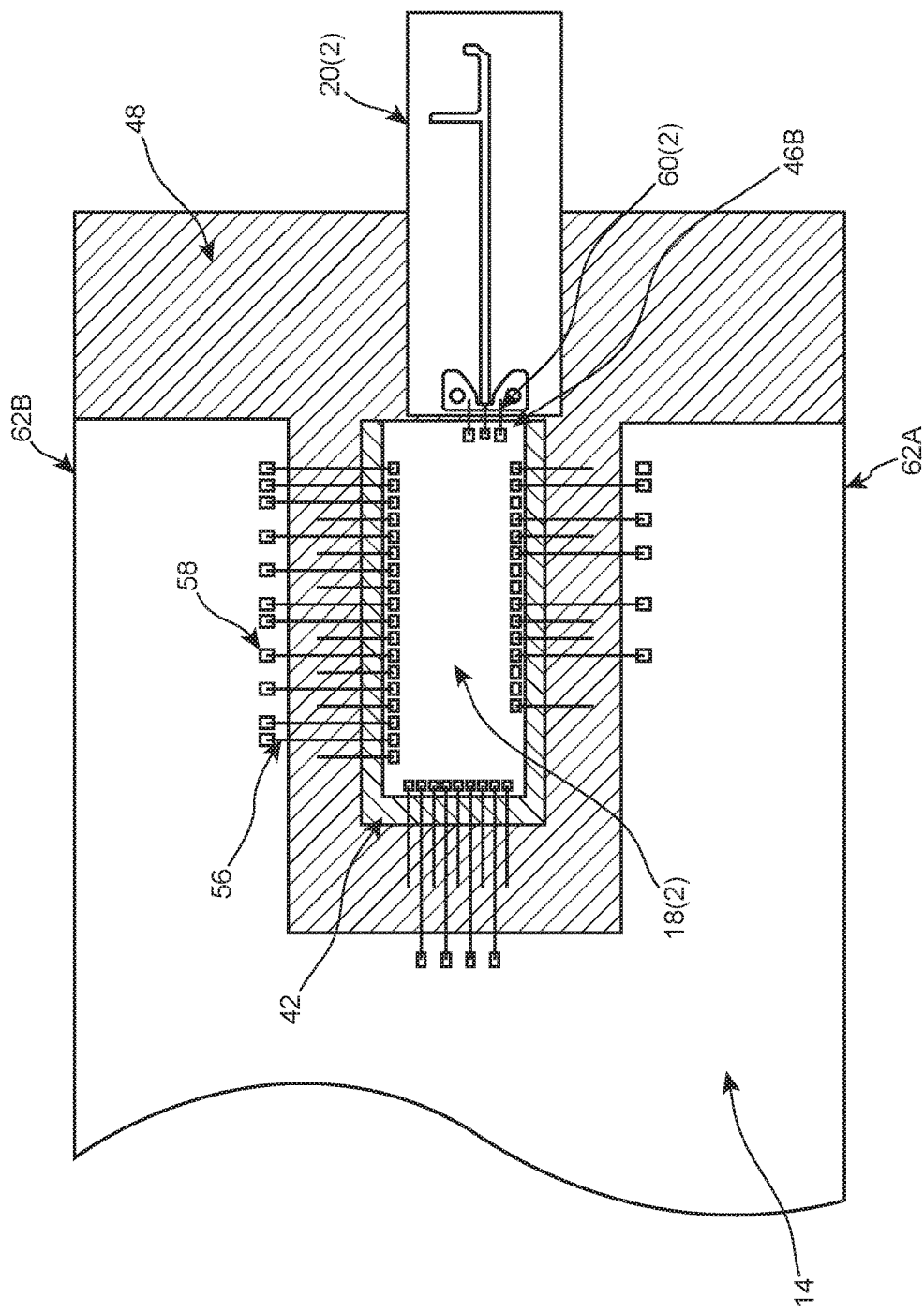
FIG. 16B is a top view of an exemplary receiver printed circuit board and launch transducer substrate assembly for use with the waveguide interfaces of the present technology.

The cut out area 42 as shown in FIGS. 4, 15A, 15B, 16A, and 16B, which is a recessed portion of the printed circuit board assembly 14 configured to receive the communication device 18(1), includes the cut out bottom surface 44 and cut out side surfaces 46A and 46B, is metallized using standard printed circuit plating techniques. The cut out area 42 is copper and gold plated to maintain a continuous electrical ground plane, although other conductive materials may be utilized. Printed circuit board assembly 14 further includes a top ground plane area 48 (as shown in FIGS. 4, 16A, and 16B), a side ground plane area 50, a front ground plane area 52, and a bottom ground plane area 54 that are metallized using standard printed circuit plating techniques, such that the top ground plane area 48, the side ground plane area 50, the front ground plane area 52, and the bottom ground plane area 54 are electrically contiguous. The top ground plane area 48, the side ground plane area 50, the front ground plane area 52, and the bottom ground plane area 54 are copper and gold plated, although other conductive materials may be utilized. The top ground plane area 48 is further electrically contiguous with the cutout side surfaces 46A and 46B and the cut out bottom surface 44 of the cut out area 42. The front ground plane area 52 provides an electrical ground plane in the local interface region of the interface plate 26(1) or interface 26(2) and waveguide flange 22.

Referring now to FIG. 16A, a top detailed view of the of the printed circuit board assembly 14 shown in FIGS. 15A-15D along with communication device 18(1) and launch transducer 20(1), which provide a transmitter printed circuit board assembly, is shown. As shown in FIG. 16A, the communication device 18(1), which is a transmitter communication device, is affixed within the cut out area 42 of the printed circuit assembly 14 and is positioned to abut the cut out area side surface 46B adjacent to the launch transducer 20(1).

Low-frequency signal and power connections are supplied to the communication device 18(1) via a plurality of wire bonds 56 from corresponding wire bond pads 58, although other interconnection technologies besides wire bond pads 58 may be utilized. High-frequency millimeter wave connections are provided between the communication device 18(1) and the adjacently positioned launch transducer 20(1) with low-inductance wire or ribbon bonds 60(1), although other connection technologies may be utilized. The printed circuit assembly 14 includes a width defined by edges 62A and 62B.

Referring now to FIG. 16B, a top detailed view of the of the printed circuit board assembly 14 along with the communication device 18(2) and launch transducer 20(2), which provide a receiver printed circuit board assembly, is shown. The communication device 18(2), which is a receiver communication device, is affixed within printed circuit assembly cut out area 42, which is a recessed portion of the printed circuit board assembly 14 configured to receive the communication device 18(1), and located to abut the cut out area side surface 46 adjacent to the launch transducer 20(2).

Low-frequency signal and power connections from the printed circuit assembly 14 are provided to the communication device 18(2) via a plurality of wire bonds 56 from corresponding wire bond pads 58, although other interconnection technologies may be utilized. High-frequency millimeter wave connections are communicated between the communication device 18(2) and the launch transducer 20(2) with low-inductance wire or ribbon bonds 60(2), although other connection technologies may be utilized.

Referring again to FIG. 1A, the connector 16 utilized in the waveguide assembly 10 is a multi-pin connector that provides the lower-frequency electrical signals and power connections to the communication device 18(1), although other types of connectors suitable to provide the lower-frequency electrical signals and power connections to the communication device 18(1) may be utilized. The connector 16 is located on the printed circuit assembly 14 at the rear of the waveguide interface 12(1).

The communication device 18(1) is a highly integrated millimeter wave radio transmitter that is attached to the printed circuit assembly 14, although the communication device may alternatively be a highly integrated millimeter wave radio receiver, such as communication device 18(2) shown in FIG. 16B. In one example, the communication device 18(1), 18(2) is a silicon germanium (SiGe) chip, although gallium arsenide (GaAs), complimentary metal oxide semiconductor (CMOS), or other semiconductor chips may be utilized for the communication device 18(1), 18(2). The communication device 18(1), 18(2), by way of example only, may be configured to work with a 60 GHz millimeter wave launch transducer 20(1), 20(2). The communication device 18(1) is a balanced output connection at the transmitter output terminal, while communication device 18(2) is an unbalanced input connection to the receiver input terminals. In one example, the communication device 18(1), 18(2) is protected from the environment by a protective cover 64 as shown in FIGS. 1A and 1C . The protective cover 64 is made of plastic, although the protective cover 64 may be constructed from other non-conductive materials may be utilized.

Referring again to FIG. 16A, in this example the printed circuit board assembly further includes the launch transducer 20(1), which acts as a transmitter. In one example, the waveguide assembly 10 utilizes a 60 GHz millimeter wave launch transducer 20(1) and enabled communication device 18(1), although the present technology is not limited thereto. Additionally, the launch transducer 20(1) is implemented with matching balanced transmission line terminals to efficiently accept high-frequency energy from the communication device 18(1). Launch transducer 20(1) is located precisely at the midpoint between width edges 62A and 62B of the printed circuit assembly 14. Additionally, the launch transducer 20(1) has a width dimension $Y_t$ that is precisely matched to the opening of the waveguide flange dimension, as discussed below.

Figure 17A:
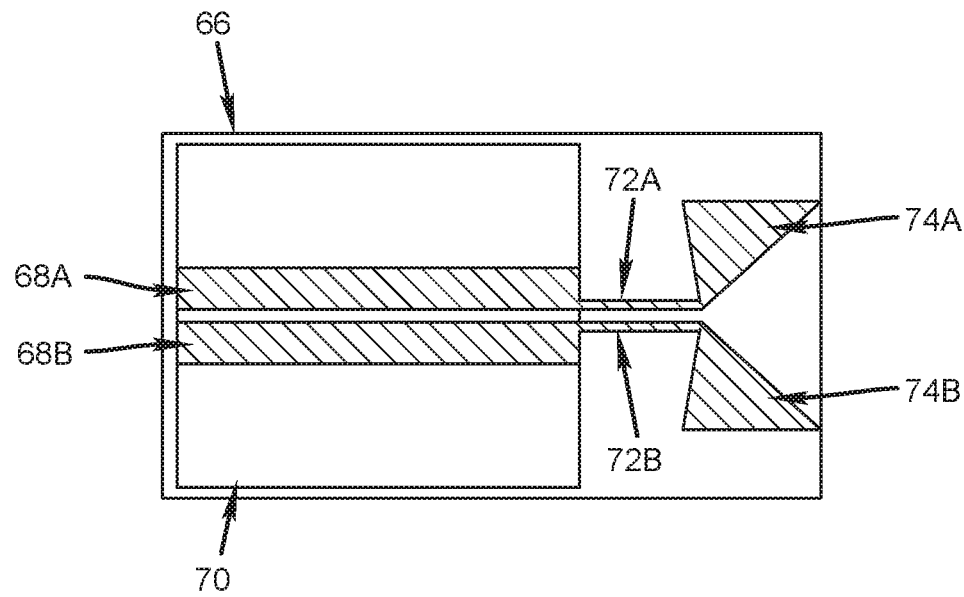
FIGS. 17A and 17B are top and bottom views of an exemplary transmitter launch transducer substrate.
Figure 17B:
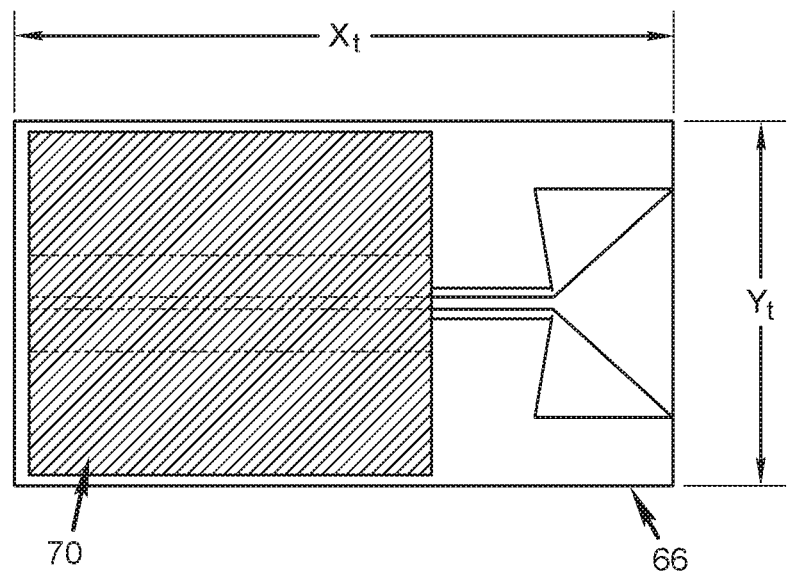

FIGS. 17A and 17B show top and bottom views of the transmitter launch transducer 20(1). As shown in FIGS. 17A and 17B, the launch transducer 20(1) is composed of low-loss substrate 66 which has a top metallization pattern and bottom metallization pattern. In this example, the low-loss substrate 66 is composed of fused silica (silicon dioxide) and is 254 micrometers (μm) thick, although other low-loss substrate materials and other material thickness values may be utilized. The metallization pattern is substantially composed of vacuum deposited gold metal from vacuum deposition techniques, although other deposition methods may be utilized.

The top metallization pattern of the transmitter launch transducer 20(1) is composed of a first pair of transmission line sections 68A and 68B as shown in FIG. 17A. The first pair of transmission line sections 68A and 68B are implemented over a ground plane 70 on the bottom side of the low-loss substrate 66. The first pair of transmission line sections 68A and 68B couple energy from the communication device 18(1) via bond wires 60(1), as shown in FIG. 16A, or other means to a second pair of transmission line sections 72A and 72B as shown in FIG. 17A. The first pair of transmission line sections 68A and 68B are implemented to match the output impedance of the communication device 18(1) and the bond wires 60(1), as shown in FIG. 16A, in a balanced configuration.

The second pair of transmission line sections 72A and 72B are located over a clear substrate section (with no ground plane on the bottom side of the low-loss substrate 66 in this section as shown in FIG. 17B) and provide energy from the first pair of transmission lines 68A and 68B to a pair of corresponding transducer elements 74A and 74B as shown in FIG. 17A. The second pair of transmission line sections 72A and 72B are implemented to match the input impedance of the transducer elements 74A and 74B.

Figure 5B:
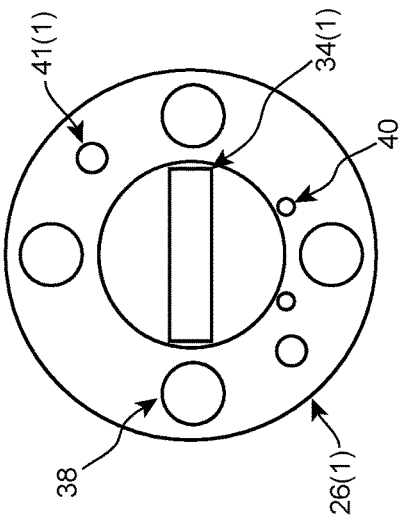
FIG. 5B is rear view of the interface plate of the exemplary waveguide interface shown in FIGS. 1A-1C.
Figure 5C:
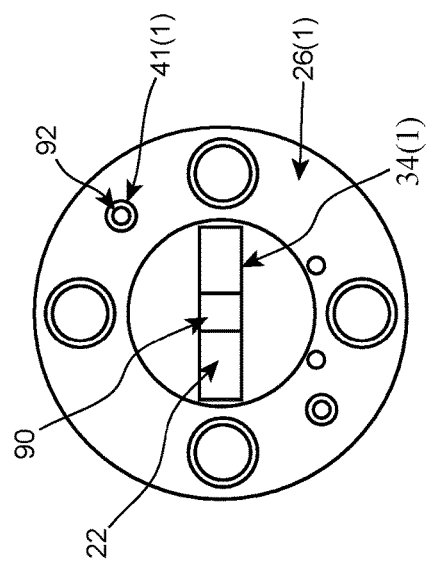
FIG. 5C is a rear view of the exemplary waveguide flange shown in FIG. 5A coupled to the exemplary interface plate shown in FIG. 5B.
Figure 5A:
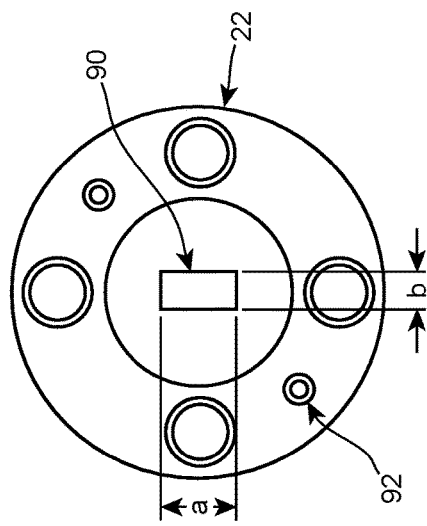
FIG. 5A is a rear view of an exemplary waveguide flange.
Figure 19:
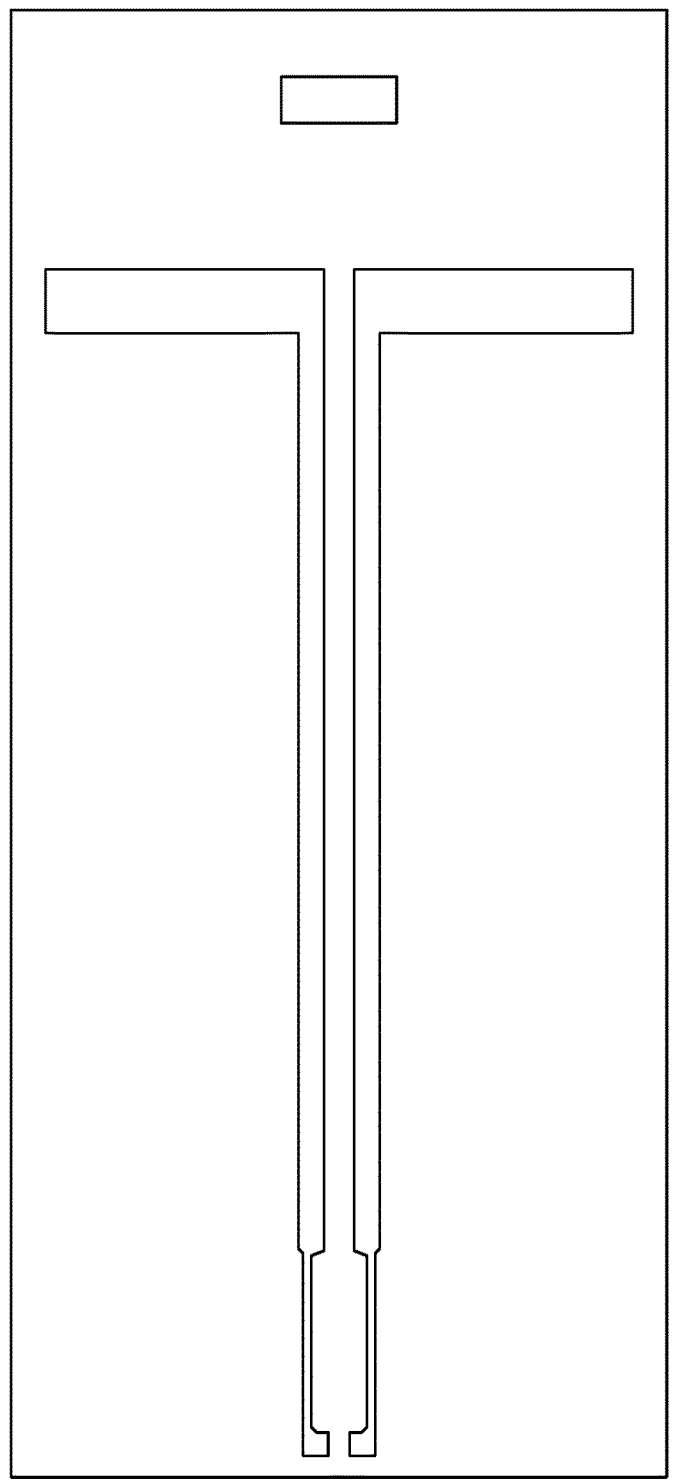
FIG. 19 is a top view of another exemplary launch transducer substrate assembly for use with the waveguide interfaces of the present technology.

The transducer elements 74A and 74B are configured to provide substantial energy propagation in a direction parallel to the low-loss substrate 66 and away from the second pair of transmission line sections 72A and 72B, thereby forming an end-fire propagation pattern into an opening in the waveguide flange opening. The launch transducer 20(1) has a width dimension, $Y_t$ (shown in FIG. 17B), that is matched to be inserted into the standard waveguide flange opening having the "b" dimension, as shown in FIG. 5A, described below. In one example, $Y_t$ is 1.80 mm and the value of $X_t$ (shown in FIG. 17B) is 2.87 mm, although other values for these dimensions are contemplated. Although an exemplary configuration for the launch transducer 20(1) is illustrated and described, alternative configurations may be utilized. By way of example, in another embodiment, launch transducer 20(1) may include a variation of a dipole with a parasitic element as illustrated in FIG. 19.

Referring again FIG. 16B, in another example the printed circuit board assembly 14 includes the launch transducer 20(2), which acts as a receiver. In one example, the waveguide assembly 10 utilizes a 60 GHz millimeter wave launch transducer 20(2) and enabled communication device 18(2), although the present technology is not limited thereto. The launch transducer 20(2) is implemented with matching unbalanced transmission line terminals to efficiently deliver high-frequency energy to the communication device 18(2). The launch transducer 20(2) is located precisely at the midpoint between printed circuit assembly 14 width edges 62A and 62B The launch transducer 20(2) has a width that is precisely matched to the to the opening of the waveguide flange dimension, as discussed below.

Figure 18A:
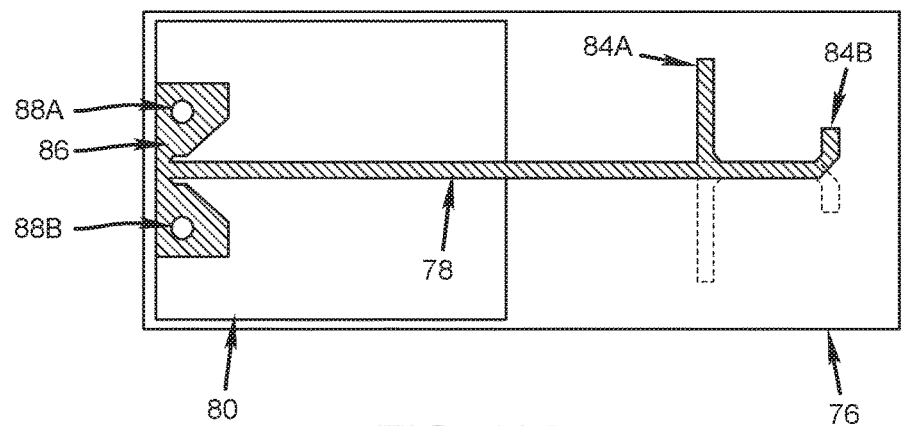
FIGS. 18A and 18B are top and bottom views of an exemplary receiver launch transducer substrate.
Figure 18B:
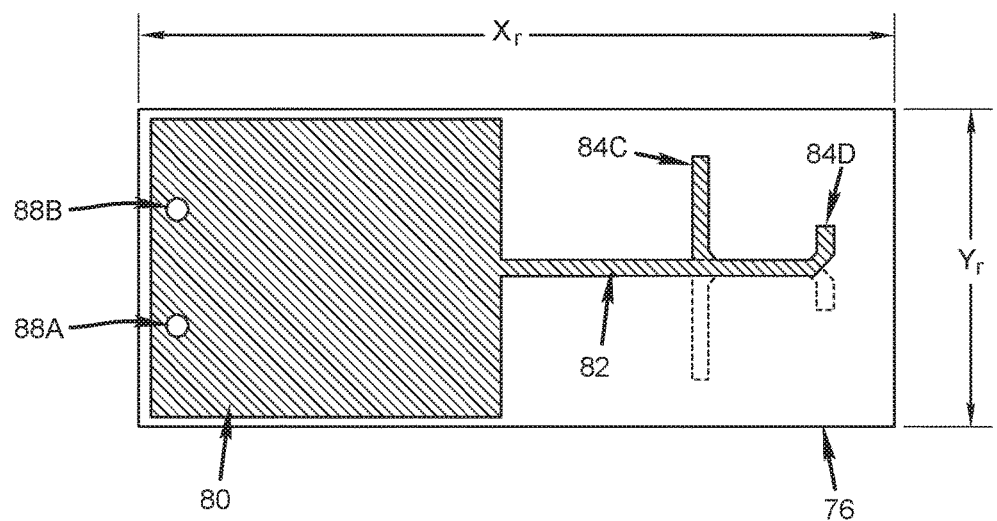

FIGS. 18A and 18B show top and bottom views of a receiver launch transducer 20(2). Receiver launch transducer has dimensions $X_r$ and $Y_r$ as shown in FIG. 18B in a similar manner as described with respect to FIG. 17 B above. The launch transducer 20(2) is composed of a low-loss substrate 76 which has a top metallization pattern and bottom metallization pattern. In this example, the substrate 76 is composed of alumina (aluminum oxide) and is 127 micrometers (μm) thick, although other low-loss substrate materials and other material thickness values may be utilized. The metallization pattern is substantially composed of vacuum deposited gold metal using vacuum deposition techniques or other appropriate methods.

In this example, the top metallization pattern includes a transmission line center conductor 78 (FIG. 18A) that traverses a length over a ground plane 80, which is located on the bottom side of the low-loss substrate 76. Beyond the position of ground plane 80, the transmission line center conductor 78 continues and is positioned over a bottom side transmission line 82 (FIG. 18B). The transmission line center conductor 78 and the bottom side transmission line 82 together are coupled to transducer elements 84A (FIG. 17A), 84B (FIG. 17A), 84C (FIG. 17B), and 84D (FIG. 17B). The transducer elements 84A and 84B and 84C and 84D, respectively, form dual element dipoles and are configured to provide a directional propagation pattern in a direction parallel to the low-loss substrate 76 and away from the transmission line center conductor 78 and the bottom side transmission line 82, thereby forming an end-fire propagation pattern into a waveguide flange opening, as discussed below.

Figure 3:
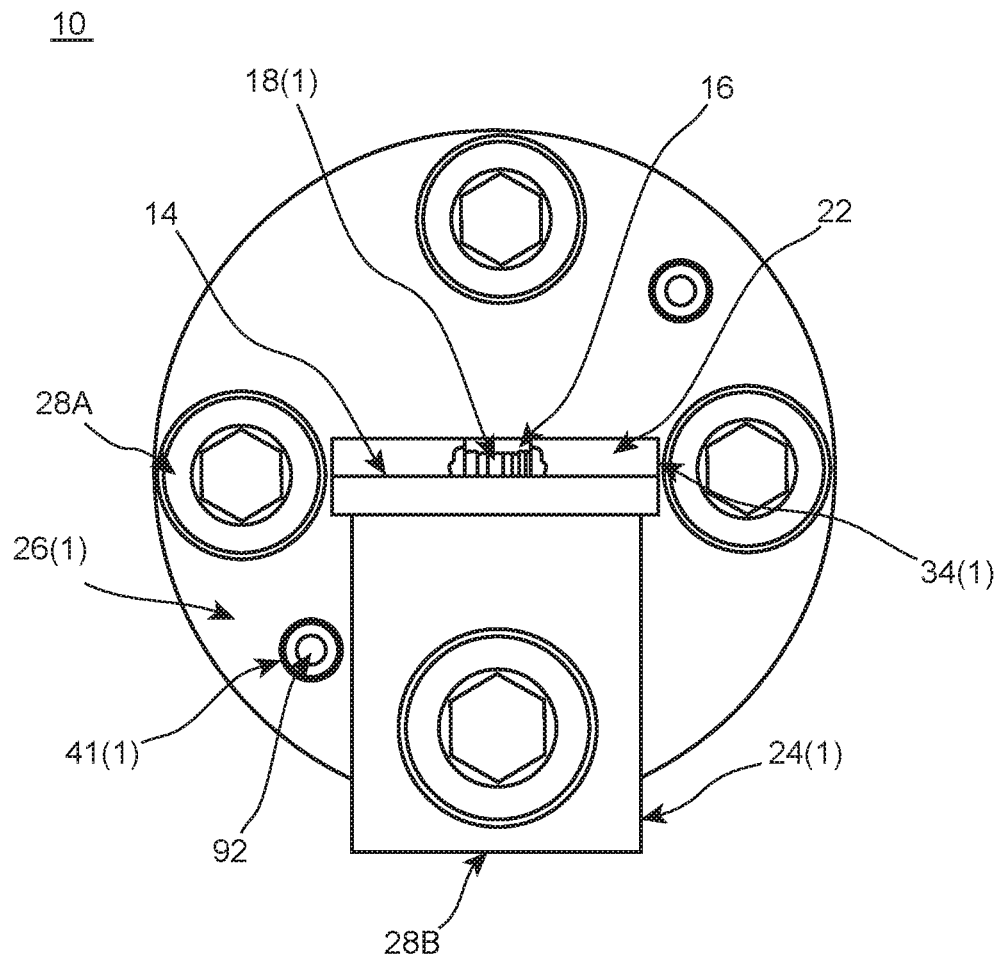
FIG. 3 is a detailed rear view of the exemplary waveguide assembly shown in FIGS. 1A-1C.

The unbalanced input circuit configuration is composed of a ground connection 86 and the transmission line center conductor 78. The ground connection 86 (FIG. 18A) is electrically connected through the low-loss substrate 76 and facilitated by metalized plating through holes (also known as vias) 88A and 88B, thereby forming a low-inductance connection to the ground plane 80 on the bottom side of the low-loss substrate 76. In one example, the diameter of via holes 88A and 88B is 127 micrometers (μm) with gold metallization formed on the inner walls, although other dimensions and material selections are contemplated. FIG. 19 illustrates another exemplary launch transducer that may be utilized with the examples of the present technology disclosed herein. B10,AMD,M Referring again to FIGS. 1A, 1B, 1C, 2, 3, and 4, the waveguide interface 12(1) is coupled to the waveguide flange 22. The waveguide flange 22 is a standard waveguide flange known in the art. As shown in FIGS. 2 and 4, the waveguide flange 22 includes a waveguide flange opening 90 that may be aligned with the rectangular slot 34(1) in the interface plate 26(1) of the waveguide interface 12(1). The waveguide opening 90 is rectangular having an "a" dimension (FIGS. 2 and 5A) representing the H-field for a rectangular waveguide. Precise alignment of interface plate 26(1) with the standard waveguide flange 22 is facilitated by the standard waveguide flange guide pins 92 (shown in FIGS. 1A, 1B, and 3) inserted into guide pin holes 41(1) as shown in FIG. 3 contained within interface plate 26(1). FIG. 5C illustrates the waveguide flange 22 coupled to the interface plate 26(1), wherein the interface plate 26(1) is aligned to the waveguide flange assembly 22 with the rectangular slot 34(1) of the interface plate 26(1) overlapping with the waveguide flange opening 90 with the standard waveguide flange guide pins 92 inserted into the guide pin holes 41(1).

As shown in FIG. 5A, the waveguide flange 22 includes the waveguide opening 90 positioned substantially in the center of the circular waveguide flange 22. In particular, the waveguide opening 90 is rectangular having an "a" dimension representing the H-field and a "b" dimension representing the E-field for a rectangular waveguide. In this example, the dimensions of the waveguide opening 90 are configured to be utilized for the frequency range of 50 to 75 GHz, whereby the dimensions are defined by what is known categorized in the art as WR-15 or in military standard MIL-DTL-85/3C as M85/3-018. By way of example only, for the 50 to 75 GHz standard waveguide frequency range, also known as V-band, the "a" dimension is approximately 3.76 mm and the "b" dimension is approximately 1.88 mm, although other "a" and "b" dimensions may be utilized depending on the type of application and/or the frequency range desired. Precise alignment of interface plate 26(1) with the standard waveguide flange 22 is facilitated by the standard waveguide flange guide pins 92 inserted into guide pin holes 41(1) contained within interface plate 26(1), as discussed above.

An example of the operation of the waveguide assembly 10, including either waveguide interface 12(1) or waveguide interface 12(2) will now be described with respect to FIGS. 1A, 1B, 1C, 2, 3, 4, 5A, 5B, 5C, 6A, 6B, 6C, 7, 8, 9, 10, 11, 12, 13, 14, 15A, 15B, 15C, 15D, 16A, 16B, 17A, 17B, 18A, 18B, and 19. It should be noted that the detailed description of the transmitter waveguide interface operation applies equally to the receiver waveguide interface with the direction of the millimeter wave transduction and energy reversed. Those of ordinary skill in the art will realize that both the transmission context and the reception context equally apply due to the Lorentz electromagnetic reciprocity theorem. It is also noted that although the operation is discussed with respect to waveguide interface 12(1), the operation of waveguide interface 12(2) is substantially the same as waveguide interface 12(1).

Critical to the high efficiency and operation of the waveguide interfaces 12(1) and 12(2) is to facilitate propagation of millimeter wave energy into standard waveguide flange opening 90 and also restrict energy losses as the conducted electrical energy moves from the communications device 18(1) through the high frequency wire bonds 60(1) to the first pair of transmission lines 68A and 68B. The short waveguide segment 36 as shown in FIGS. 2 and 11 is defined between the rectangular slot 34(1) of interface plate 26(1), or interface 26(2), and the upper ground plane surface 48 of the printed circuit board assembly 14. The printed circuit board assembly 14 also has contiguous copper plating at side ground plane area 50 and front ground plane area 52, which form the lower portion of the short waveguide segment 36.

The waveguide cutoff frequency is the frequency at which all frequencies below the cutoff frequency are substantially attenuated. Equation [1], derived from the Helmholtz equation for electromagnetic waves, provides the waveguide cutoff frequency for rectangular waveguide with an internal H-field "a" dimension and internal E-field "b" dimension.

$$\omega_c = c\sqrt{\left(\frac{n\pi}{a}\right)^2 + \left(\frac{m\pi}{b}\right)^2} \qquad [1]$$

In equation [1], $\omega_c$ is radian frequency, c is the speed of light, a is the H-field rectangular waveguide dimension, b is the E-field rectangular waveguide dimension, and n and m represent the waveguide mode numbers. The dominant waveguide mode is used to determine waveguide cutoff and is known in the art as transverse electric mode 1,0 ($TE_{1,0}$) where n=1 and m=0. With n=1 and m=0, the only variable remaining is the waveguide H-field "a" dimension.

In one example, for the standard waveguide flange 22, the "a" dimension is 3.76 mm which yields a cutoff frequency of 39.9 GHz, well below the intended operating frequency range of standard waveguide flange 22, which is 50 to 75 GHz. However, it is desired to substantially attenuate the transduction of energy over the operating frequency range of the waveguide interface in the short waveguide segment 36.

The H-field dimension of short waveguide segment 36 is shown as the "a'" dimension in FIG. 2. In one example, the "a'" dimension is approximately 0.98 mm (980µm). Setting a in equation to 0.98 mm with dominant mode (n=1 and m=0) yields a cutoff frequency of 153 GHz, well above the intended operating range of the waveguide interface. There will be slight variations of the cutoff frequency as the dimension "a'" varies as a function of the thickness of the printed circuit board assembly 14 and the effective dimension "a'" varies due to the dielectric loading properties and thickness variation of launch transducer 20(1). However, with all variations taken into account, the minimum waveguide cutoff frequency for either the transmitter waveguide interface or the receiver waveguide interface is greater than 120 GHz. By establishing short segment waveguide 36 cutoff frequency well above the operating frequency range of the waveguide interface, maximum energy is provided to the standard waveguide opening 90.

Accordingly, this exemplary technology provides a number of advantages including providing a waveguide assembly including a waveguide interface that may be utilized at high operating frequencies. The waveguide assembly of the present technology incorporates, in one example, a waveguide interface that is molded as a single piece, with nominal impact on the overall performance of the waveguide assembly.

Having thus described the basic concept of the disclosed technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the disclosed technology. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method comprising:
providing a mold configured to form a support block configured to support a printed circuit board assembly and an interface integrally formed to an end portion of the support block and that extends from the support block, the interface having a slot configured to receive at least a portion of the printed circuit board assembly and one or more holes positioned to receive attachment devices to secure the interface to a waveguide flange; and
using the provided mold to form a waveguide interface as a monolithic device.

2. The method of claim 1 further comprising:
affixing the printed circuit board assembly to the support block of the waveguide interface;
coupling a communication device to the printed circuit board assembly;
coupling a launch transducer to the communication device, wherein the launch transducer is positioned adjacent to the communication device;
coupling the waveguide interface to the waveguide flange, the waveguide flange having a waveguide opening.

3. The method of claim 2, wherein a second portion of the launch transducer is positioned within the waveguide opening.

4. The method of claim 2, wherein the launch transducer is positioned near a top surface of the support block midway between opposing edges of the top surface of the support block.

5. The method of claim 2, wherein the communication device is positioned within a recess in the printed circuit board such that a first portion of the launch transducer is at a predetermined height within the slot within the interface plate.

6. The method of claim 2, wherein the launch transducer is positioned to provide maximum energy propagation along a central axis of a waveguide component.

7. The method of claim 2 wherein the launch transducer has an operating frequency range of 57 GHz to 66 GHz.

8. The method of claim 2, wherein the slot within the interface comprises sidewalls having a draft angle of about two degrees, wherein the draft angle impacts transmission of millimeter waveguide energy into the waveguide opening by less than one percent.

9. The method of claim 2, wherein the interface is positioned flush against the waveguide flange such that a narrow dimension of the slot within the interface is orthogonal to a H-field dimension of the waveguide flange.

10. The method of claim 2, wherein a first portion of the launch transducer is positioned within the slot within the interface such that the slot prevents energy from a transmission line from being emitted toward the printed circuit board assembly or the waveguide opening and allows energy to pass from the launch transducer into the waveguide opening.

11. The method of claim 2, wherein the communication device is configured to transmit and receive millimeter wave signals.

12. The method of claim 2, wherein the launch transducer further comprises a low-loss dielectric material with deposited metallization.

13. The method of claim 1, wherein the waveguide interface is formed from a moldable metal alloy.

14. The method of claim 1, wherein the support block and interface comprise a plurality of draft angles along one or more surfaces of the support block and the interface to allow for removal from a mold.

* * * * *